(12) United States Patent
Chen et al.

(10) Patent No.: US 12,720,907 B2
(45) Date of Patent: Aug. 25, 2026

(54) STRUCTURE OF ULTRAVIOLET LIGHT SENSING-ENHANCED PHOTODIODE

(71) Applicant: Taiwan-Asia Semiconductor Corporation, Hsinchu City (TW)

(72) Inventors: Chuan-Wei Chen, Hsinchu City (TW); Yen-Chun Tseng, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 390 days.

(21) Appl. No.: 18/495,605

(22) Filed: Oct. 26, 2023

(65) Prior Publication Data

US 2024/0194804 A1 Jun. 13, 2024

(30) Foreign Application Priority Data

Dec. 8, 2022 (TW) ................................ 111147282

(51) Int. Cl.
*H01L 31/0232* (2014.01)
*C09K 11/66* (2006.01)
(Continued)

(52) U.S. Cl.
CPC ............ *H10F 77/496* (2025.01); *C09K 11/66* (2013.01); *H10F 30/221* (2025.01); (Continued)

(58) Field of Classification Search
CPC ...... H10F 30/22; H10F 30/221; H10F 77/413; H10F 77/45; H10F 77/496
See application file for complete search history.

(56) References Cited

U.S. PATENT DOCUMENTS 10,996,105 B2 5/2021 Nagaya et al.
2015/0279884 A1* 10/2015 Kusumoto ............ H10F 39/199 257/43

(Continued)

FOREIGN PATENT DOCUMENTS

CN 101022139 A 8/2007
CN 106549076 A 3/2017

(Continued)

OTHER PUBLICATIONS

Machine translation, Zhu, Chinese Pat. Pub. No. CN-215869409-U, translation date: Dec. 29, 2025, Espacenet, all pages. (Year: 2025).*

(Continued)

*Primary Examiner* — Victoria K. Hall

(74) *Attorney, Agent, or Firm* — MUNCY, GEISSLER, OLDS & LOWE, P.C.

(57) ABSTRACT

The present disclosure provides a structure of an ultraviolet light sensing-enhanced photodiode. The main structure of the photodiode includes a silicon photodiode and an infrared conversion layer formed on a surface that receives an ultraviolet light of the of the silicon photodiode. When the ultraviolet light irradiates on the ultraviolet light sensing-enhanced photodiode through the infrared conversion layer, the infrared conversion layer converts the ultraviolet light into an infrared light. The first portion of the infrared light is propagated to the silicon photodiode and then converted (Continued)

to a photoelectric current. The second portion of the infrared light is absorbed by the infrared conversion layer. An infrared reflection layer is also provided for reflecting the third portion of the infrared light that is originally escaped from the infrared reflection layer, and the third portion of the infrared light can be reflected into the silicon photodiode.

10 Claims, 11 Drawing Sheets

(51) Int. Cl.

| | |
|---|---|
| ***H01L 31/0216*** | (2014.01) |
| ***H01L 31/103*** | (2006.01) |
| ***H10F 30/221*** | (2025.01) |
| ***H10F 77/122*** | (2025.01) |
| ***H10F 77/1226*** | (2025.01) |
| ***H10F 77/30*** | (2025.01) |
| ***H10F 77/40*** | (2025.01) |
| *B82Y 20/00* | (2011.01) |

(52) U.S. Cl.
CPC ....... *H10F 77/122* (2025.01); *H10F 77/1226* (2025.01); *H10F 77/306* (2025.01); *H10F 77/334* (2025.01); *H10F 77/337* (2025.01); *H10F 77/413* (2025.01); *B82Y 20/00* (2013.01)

(56) References Cited

U.S. PATENT DOCUMENTS

| | | | | |
|---|---|---|---|---|
| 2022/0021465 | A1* | 1/2022 | Ooi | C09K 11/66 |
| 2022/0064524 | A1* | 3/2022 | Sinatra | C08K 3/36 |
| 2022/0149214 | A1 | 5/2022 | Sun et al. | |

FOREIGN PATENT DOCUMENTS

| | | | | | |
|---|---|---|---|---|---|
| CN | 112912465 | A | | 6/2021 | |
| CN | 215869409 | U | * | 2/2022 | H01L 31/0232 |
| TW | 365443 | U | | 7/1999 | |
| TW | 201530101 | A | | 8/2015 | |
| TW | M619237 | U | | 11/2021 | |

OTHER PUBLICATIONS

Taiwan Intellectual Property Office, Non-Final Rejection, Taiwan Application No. TW111147282, Sep. 9, 2023, all pages. (Year: 2023).*

* cited by examiner

| H |
|---|
| L |
| H |
| L |
| H |
| L |
| H |
| L |
| H |

FIG.10

STRUCTURE OF ULTRAVIOLET LIGHT SENSING-ENHANCED PHOTODIODE

CROSS-REFERENCES TO RELATED APPLICATIONS

This application claims the benefit of priority to Taiwanese Patent Application No. 111147282 filed on Dec. 8, 2022, which is hereby incorporated by reference in its entirety.

BACKGROUND OF THE INVENTION

Field of the Invention

The present invention relates to a photodiode, in particular an ultraviolet light sensing-enhanced photodiode that internally converts ultraviolet light into infrared light through an infrared conversion layer to enhance light sensing.

Descriptions of the Related Art

The conventional silicon photodiode (Si photodiode) made with silicon as the base material can refer to the planar structure diagram shown in FIG. 1. The main structure of the photodiode 100 shown therein includes a silicon as the base, the photo-sensing area 101 made of doped semiconductor materials, and the contacts such as the anode 103 and the cathode 105 made of metal materials.

The optical response of the conventional silicon photodiode in the ultraviolet (UV) band is extremely low. The optical response diagram of the photodiode can be referred to FIG. 2, which shows the optical response value (A/W) in the ultraviolet light band to infrared light band (nm). Generally speaking, the optical response of the ultraviolet light band is more than five times different from that of the infrared light band. In the conventional technology, the optical response of ultraviolet light can usually be improved only by adjusting the concentration and thickness of the silicon photo-sensing area (as the photo-sensing area 101 shown in FIG. 1), but the benefits of improving the optical response are limited.

SUMMARY OF THE INVENTION

This disclosure presents an ultraviolet light sensing-enhanced photodiode. By incorporating specific structures into the silicon photodiode, it can effectively convert the low-responsive ultraviolet light into the higher-responsive infrared light. This achieves enhanced light detection capability in the band of the ultraviolet light.

The ultraviolet light sensing-enhanced photodiode of the embodiment includes a silicon photodiode and an infrared conversion layer. The infrared conversion layer is disposed on the surface of the silicon photodiode to receive the incident ultraviolet light. When the ultraviolet light strikes the infrared conversion layer, it is absorbed by the infrared conversion layer and subsequently re-emitted as the infrared light, which is more responsive to the silicon photodiode.

When the ultraviolet light enters the infrared conversion layer and is converted to the infrared light, the first portion of the infrared light is propagated to the silicon photodiode and is transformed into an electric current by the silicon photodiode. The second portion of the infrared light, however, is absorbed by the infrared conversion layer.

Furthermore, the ultraviolet light sensing-enhanced photodiode further comprises an infrared reflection layer disposed on the surface of the infrared conversion layer for receiving the incident ultraviolet light. When the ultraviolet light irradiates the ultraviolet light sensing-enhanced photodiode, the ultraviolet light passes through and is absorbed by the infrared conversion layer to be converted into the infrared light. The infrared reflection layer is used to reflect a third portion of the infrared light that is originally escaped so that the third portion of the infrared light is reflected into the silicon photodiode and is converted into a photoelectric current by the silicon photodiode.

Furthermore, the infrared reflection layer is an infrared total reflection stacked layer that is made of multiple layers of high refractive index material dielectric films interlaced with low refractive index material dielectric films.

Preferably, the infrared reflection layer is designed to reflect the light in the wavelength ranging from 750~950 nm, while to allow high transmission of the light in the band of the visible light ranging from 400~650 nm and in the band of the ultraviolet light shorter than 400 nm.

Furthermore, the ultraviolet light sensing-enhanced photodiode further includes an ultraviolet light anti-reflection layer which is disposed the top layer of the ultraviolet light sensing-enhanced photodiode for forming destructive interference to a reflected light generated by the ultraviolet light incident to the ultraviolet light sensing-enhanced photodiode.

Additionally, corresponding to the ultraviolet anti-reflection layer, the ultraviolet light sensing-enhanced photodiode further includes an infrared light anti-reflection layer, which is disposed between the infrared conversion layer and the silicon photodiode for forming destructive interference to a reflected light generated by the infrared light incident to the ultraviolet light sensing-enhanced photodiode.

In one embodiment, the infrared conversion layer and the silicon photodiode are made of homogenous materials. By selecting different impurity materials and forming an energy difference between the energy level and energy level of the electronic conduction band, the wavelength of the radiated light can be adjusted to the band of the infrared light.

In another embodiment, the infrared conversion layer and the silicon photodiode are made of heterogeneous semiconductor materials. The energy gap of the infrared conversion layer is smaller than that of the silicon photodiode, and the wavelength of the radiated light can be adjusted to the band of the infrared light by changing the proportion of the heterogeneous semiconductor materials.

Furthermore, the infrared conversion layer is a structure including silicon germanium ($Si_xGe_{1-x}$) quantum dots. A two-dimensional periodic array pattern is defined on a dielectric material or a semiconductor material through photolithography etching technology in the infrared light total reflection stacked layer.

The detailed technology and preferred embodiments implanted for the present invention are described in the following paragraphs accompanying the appended drawings for people skilled in this field to well appreciate the features of the claimed invention.

BRIEF DESCRIPTION OF THE DRAWINGS

FIG. 10 shows a schematic view of an embodiment of the infrared light total reflection stacked layer in the ultraviolet light sensing-enhanced photodiode.

DETAILED DESCRIPTION OF THE PREFERRED EMBODIMENT

The following is a specific embodiment to illustrate the implementation of the present invention. Those skilled in the art can understand the advantages and effects of the present invention from the content disclosed in this specification. The present invention can be implemented or applied through other different specific embodiments, and various details in this specification can also be modified and changed based on different viewpoints and applications without departing from the concept of the present invention. In addition, the drawings of the present invention are only simple schematic illustrations and are not depictions based on actual dimensions, as is stated in advance. The following embodiments will further describe the relevant technical content of the present invention in detail, but the disclosed content is not intended to limit the scope of the present invention.

It should be understood that although terms such as “first”, “second” and “third” may be used herein to describe various components or signals, these components or signals should not be limited by these terms. restrictions. These terms are mainly used to distinguish one component from another component, or one signal from another signal. In addition, the term “or” used in this article shall include any one or combination of more of the associated listed items, depending on the actual situation.

Considering the significantly low optical response of conventional silicon photodiodes in the ultraviolet (UV) band, the present invention discloses an ultraviolet light sensing-enhanced photodiode. An infrared conversion layer is provided on the photodiode for converting the ultraviolet (UV) light to the infrared (IR) light band is designed. This infrared conversion layer is capable of transforming the incident UV light into the infrared light. Due to the poor optical response of the silicon photodiode to the originally incident UV light, the converted infrared light can efficiently penetrate the silicon photodiode. In this way, a highly sensitive ultraviolet light sensing-enhanced photodiode (UV photodiode) with a higher optical response efficiency would be realized, thereby achieving the stated objective of the ultraviolet light sensing-enhanced photodiode of the present invention.

Figure 1:
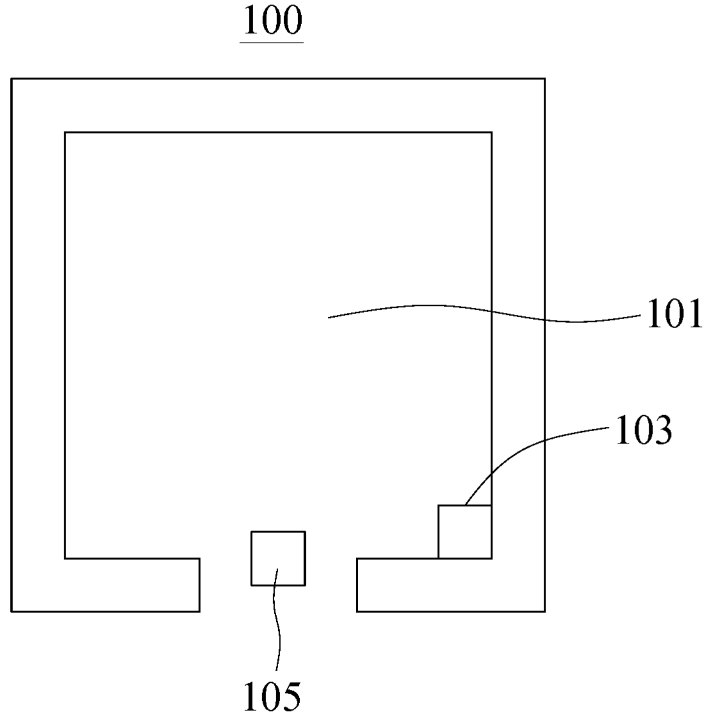
FIG. 1 shows the planar structure diagram of a conventional photodiode.
Figure 2:
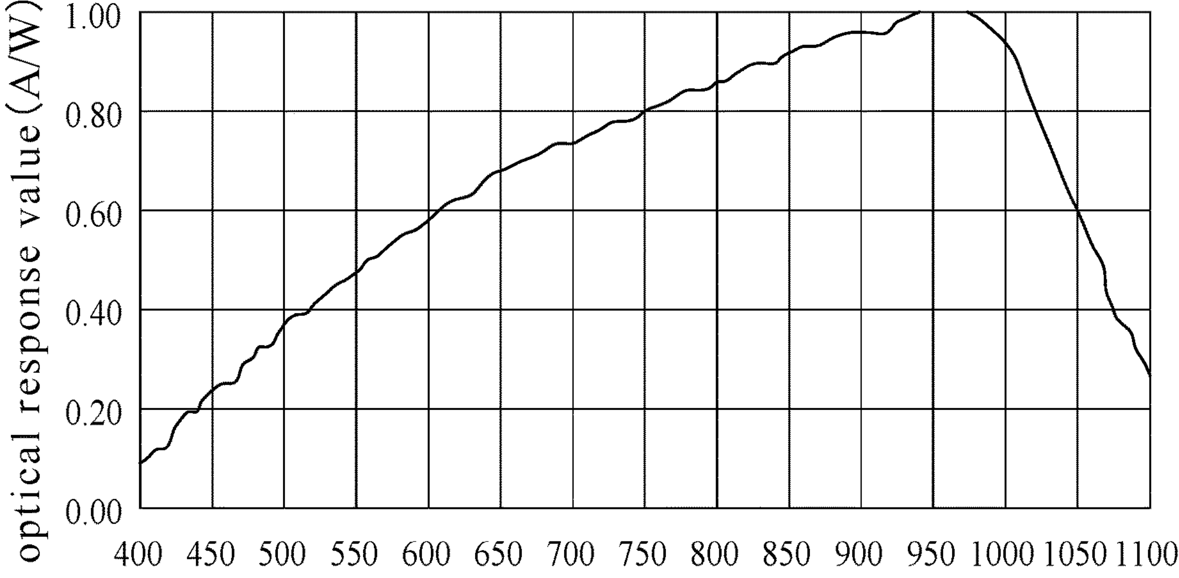
FIG. 2 shows the optical response diagram of the light-emitting diode.
Figure 3:
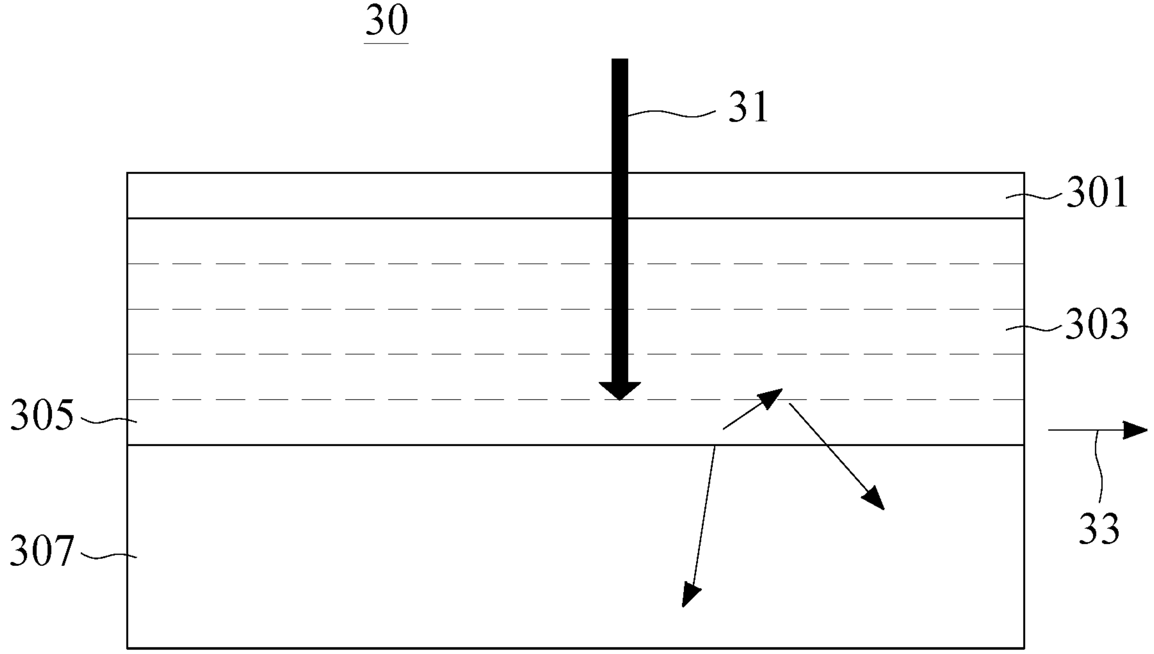
FIG. 3 shows a schematic view of a structural embodiment of an ultraviolet light sensing-enhanced photodiode.
Figure 4:
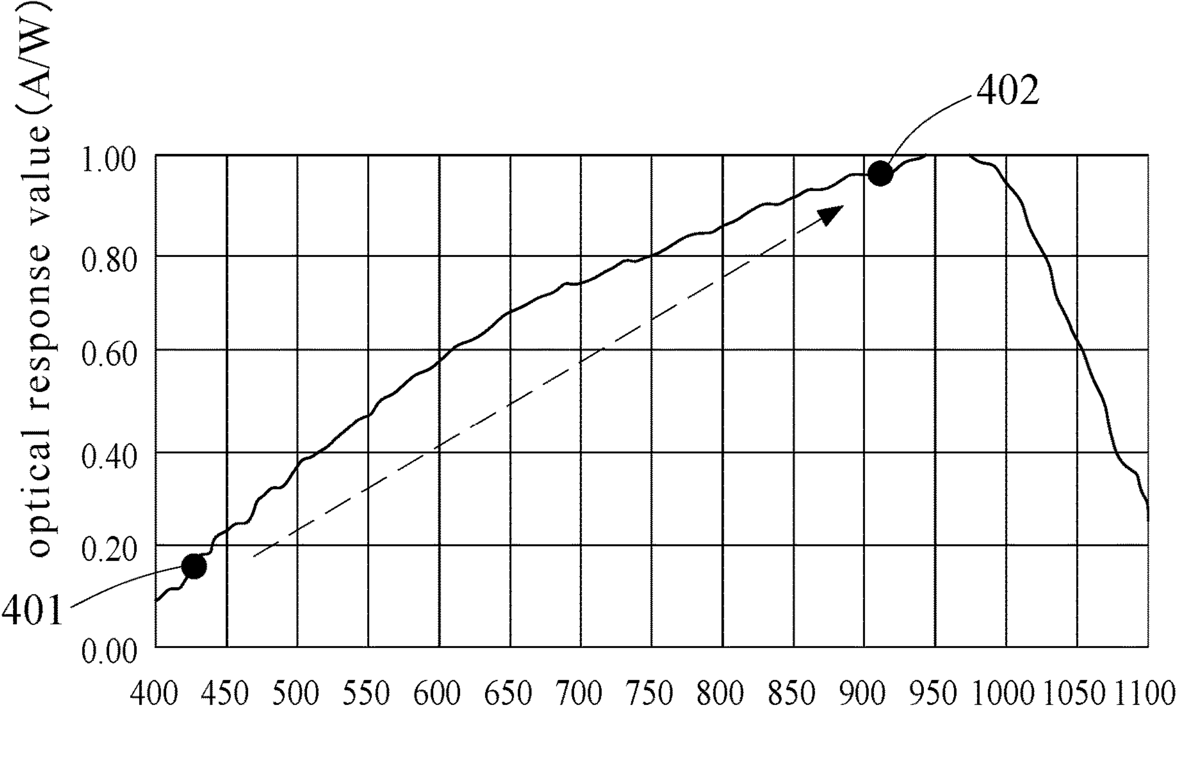
FIG. 4 shows the objective optical response diagram of the ultraviolet light sensing-enhanced photodiode.

FIG. 3 illustrates a schematic view of a main structure of the ultraviolet light sensing-enhanced photodiode in one of the embodiments of the present invention. According to the description above, the main structure of the ultraviolet light sensing-enhanced photodiode 30 comprises a silicon photodiode 307 capable of converting light into electrical energy, and an infrared conversion layer 305 capable of converting the ultraviolet light into the infrared light band. Please refer to FIG. 4 which shows the objective light response diagram of the ultraviolet light sensing-enhanced photodiode. The proposed ultraviolet light sensing-enhanced photodiode 30 effectively transforms the ultraviolet light (as indicated by the position 401 in the UV band) with the originally poor optical response to the infrared light with a better optical response, as indicated by the position 402 in the infrared band.

According to the illustrated embodiment, the ultraviolet light sensing-enhanced photodiode 30 receives an incident ultraviolet light 31. The ultraviolet light 31 passes through the ultraviolet light anti-reflection layer 301 and the infrared light total reflection stacked layer 303 before entering the infrared conversion layer 305. Once the incident ultraviolet light 31, entering the infrared conversion layer 305, is absorbed and transformed into the infrared light 33, three possible paths for the light propagation will be generated. The first portion of the infrared light 33 enters the silicon photodiode 307, where it is converted into electrical energy. The second portion of the infrared light 33 is either absorbed again by the infrared conversion layer 305 or directed to output by an additional channel.

Furthermore, the third portion of the infrared light 33, which is reflected by the infrared light total reflection stacked layer 303 disposed on the surface where the ultraviolet light 31 is incident on the ultraviolet light sensing-enhanced photodiode 30, will be reflected again into the silicon photodiode 307, thereby increasing the amount of the infrared light entering the silicon photodiode 307.

Furthermore, one of the layers among the structure of the ultraviolet light sensing-enhanced photodiode 30 can be the ultraviolet light anti-reflection layer 301. Preferably, the ultraviolet light anti-reflection layer 301 is positioned at the topmost layer of the overall structure of the ultraviolet light sensing-enhanced photodiode 30, allowing the incident ultraviolet light 31 to directly strike this ultraviolet light anti-reflection layer 301. As shown in this figure, the ultraviolet light anti-reflection layer 301 is arranged, but not limited to, be disposed on the first layer in the structure of the ultraviolet light sensing-enhanced photodiode 30 for receiving the incident ultraviolet light 31. By controlling the thickness, materials, and total number of layers during the coating process for forming the ultraviolet light anti-reflection layer 301, destructive interference is formed for the reflection light generated by the incident ultraviolet light 31 to the ultraviolet light sensing-enhanced photodiode 30. This can eliminate optical noise reflected from the ultraviolet light sensing-enhanced photodiode 30, thereby enhancing the effect of light penetration through the ultraviolet light sensing-enhanced photodiode 30.

Based on the abovementioned concepts of the invention, three embodiments of the ultraviolet light sensing-enhanced photodiode are described below.

Embodiment I

Figure 5:
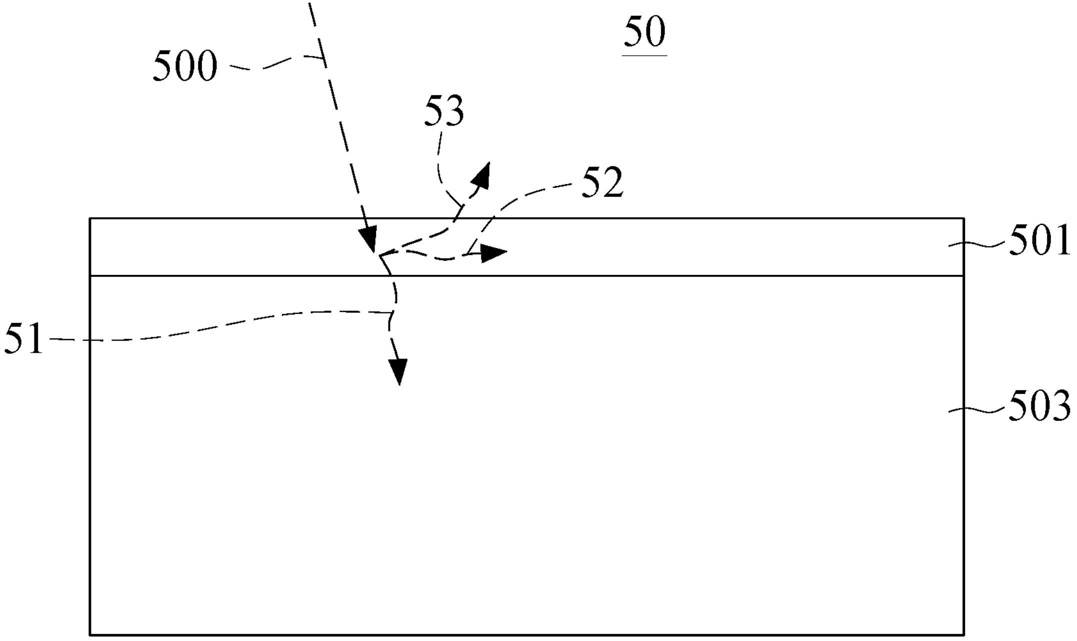
FIG. 5 shows a schematic view of the first embodiment of the ultraviolet light sensing-enhanced photodiode.

FIG. 5 illustrates a schematic view of the first embodiment of the ultraviolet light sensing-enhanced photodiode. The structure of the depicted ultraviolet light sensing-enhanced photodiode 50 includes a silicon photodiode 503 and an infrared conversion layer 501. The infrared conversion layer 501 is disposed on the surface of the silicon photodiode 503 for receiving ultraviolet light 500 and responsible for converting the incident ultraviolet light 500 into the light in the infrared band.

When the ultraviolet light 500 enters the infrared conversion layer 501, it is absorbed by the infrared conversion layer 501 and subsequently radiated as the infrared light. The infrared light can follow three possible paths. Path 51 indicates that the first portion of the infrared light will propagate to the silicon photodiode 503, where it will be absorbed and converted into a photocurrent by the silicon photodiode 503. Path 52 signifies that the second portion of the infrared light will be confined within the infrared conversion layer 501 and absorbed once again by the infrared conversion layer 501.

Furthermore, the radiated infrared light further includes the third portion. Illustrated by the third path 53, this portion of the infrared light may escape from the silicon photodiode 503, either entering into the air or entering into other structures within the ultraviolet light sensing-enhanced photodiode 50.

Among these paths, the first path 51 exhibits a better optical response for the infrared light within the silicon photodiode 503. Considering the second path 52, where the infrared light is confined within the infrared conversion layer 501 and is difficult for smoothly penetrating the silicon photodiode 503, the optical energy of the infrared light diminishes as it progresses along this path. As for the third path 53, the infrared light escapes directly, and the probability of being absorbed by the silicon photodiode 503 decreases accordingly.

Embodiment II

Figure 6:
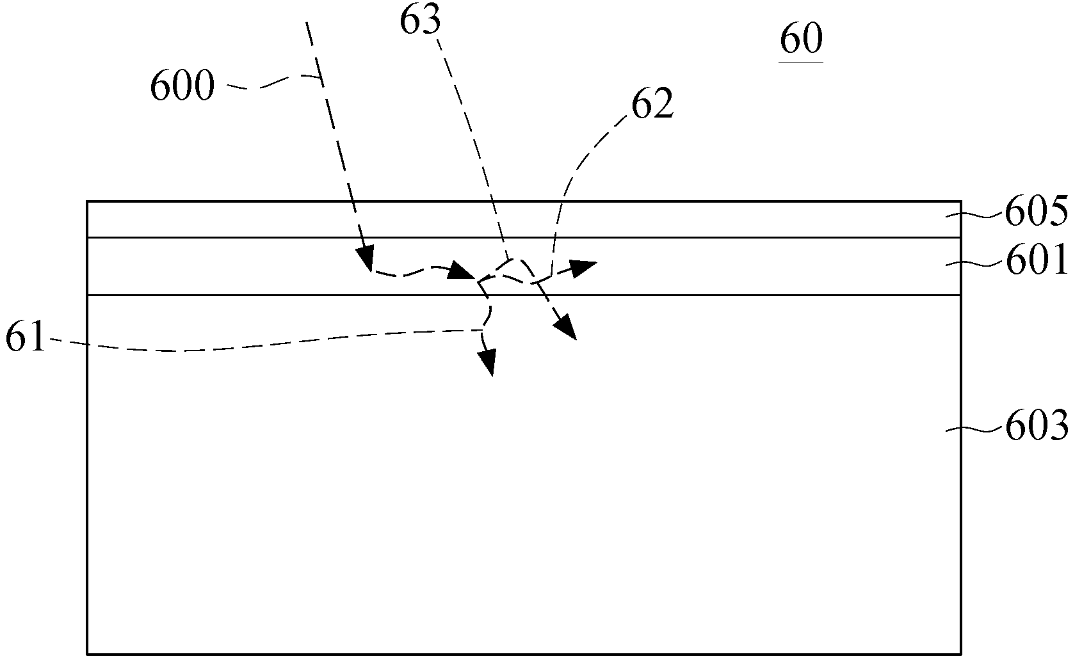
FIG. 6 shows a schematic diagram of a second embodiment of the ultraviolet light sensing-enhanced photodiode.

FIG. 6 illustrates a schematic view of the second embodiment of the ultraviolet light sensing-enhanced photodiode. In addition to the silicon photodiode 603 and the infrared conversion layer 601 shown in the first embodiment, the ultraviolet light sensing-enhanced photodiode 60 depicted in this example further includes an infrared reflection layer 605. The infrared reflection layer 605 is disposed on the surface of the infrared conversion layer 601 for receiving the incident ultraviolet light 600.

In this embodiment, when the ultraviolet light 600 is irradiated toward the ultraviolet light sensing-enhanced photodiode 60, it directly passes through the infrared reflection layer 605. The ultraviolet light 600 is then absorbed by the infrared conversion layer 601 and transformed into the infrared light. There are three possible paths for the irradiated infrared light. The infrared light in the first path 61 will continue to be propagated to the silicon photodiode 603 and be smoothly converted into a photocurrent. The infrared light in the second path 62 is absorbed by the infrared conversion layer 601 or may be emitted through specific paths.

The infrared reflection layer 605 is designed to have high reflectivity for the infrared light band. According to the embodiment, the material and structure of the infrared reflection layer 605 can be tailored to selectively reflect light in the wavelength range from 750 to 950 nm, while allowing high transmission of light in other wavelength ranges, such as the visible light range of 400 to 650 nm, and light with wavelengths shorter than 400 nm in the ultraviolet band. Consequently, the infrared reflection layer 605 can be utilized to reflect the third portion of the infrared light that originally escaped, as shown in the third path 63, and thus decreases the escaped infrared light. The third portion of the infrared light will be reflected back into the silicon photodiode 603 and be converted into a photocurrent by the silicon photodiode 603.

Furthermore, in accordance with one embodiment, the infrared reflection layer 605 can be a stacked layer for total reflection of infrared light. Refer to the schematic view shown in FIG. 10 for an example of the infrared light total reflection stacked layer. The infrared light total reflection stacked layer is made of multiple layers of high refractive index material dielectric films labeled as H, interlaced with low refractive index material dielectric films labeled as L.

In accordance with the embodiment, the thickness ($d_H$) of the dielectric layer in the high refractive index ($n_H$) material H can be designed as $\lambda/4\ n_H$, and the thickness ($d_L$) of the dielectric layer in the low refractive index (np) material L can be designed as $\lambda/4\ n_L$, where $\lambda$ is the wavelength of the light in the desired reflected band, $n_H$ is the high refractive index, and $n_L$ is the low refractive index. For example, taking the target reflection band as 800 nm to 1000 nm, assuming a stop bandwidth of 200 nm, the center wavelength ($\lambda$) can be designed at 900 nm.

Embodiment III

Figure 7:
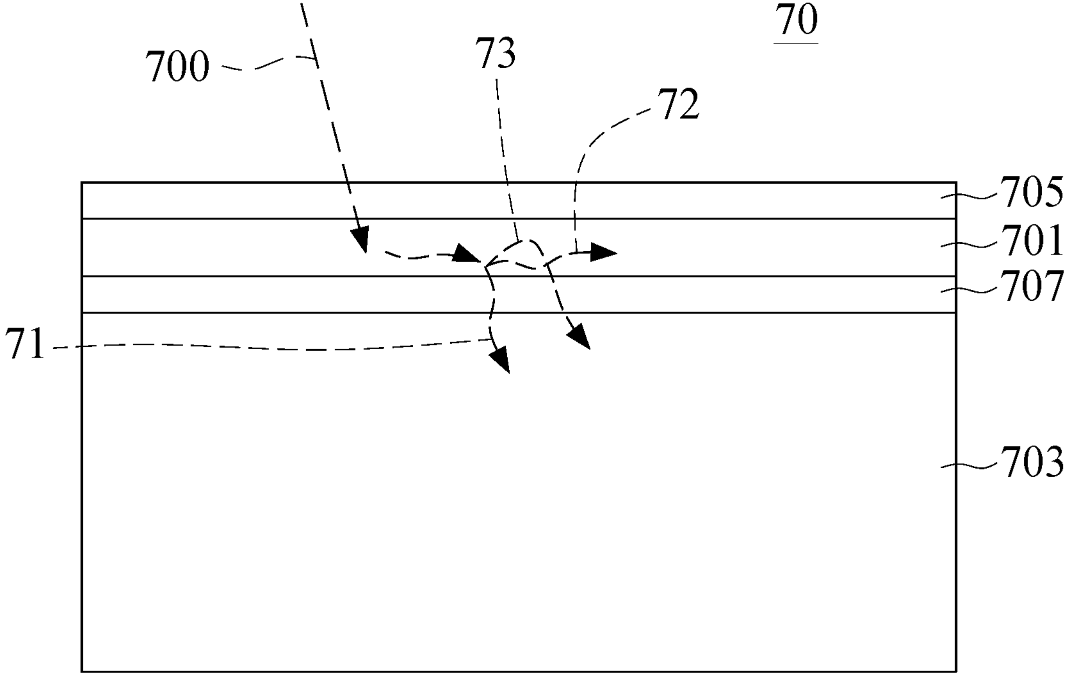
FIG. 7 shows a schematic view of a third embodiment of the ultraviolet light sensing-enhanced photodiode.

FIG. 7 illustrates a schematic view of the third embodiment of the ultraviolet light sensing-enhanced photodiode. The main structure of the ultraviolet light sensing-enhanced photodiode 70 shown in this embodiment includes a silicon photodiode 703, an infrared conversion layer 701, and an infrared reflection layer 705. The infrared conversion layer 701 and the infrared reflection layer 705 are disposed on the surface of the silicon photodiode 703 for receiving the ultraviolet light 700. Additionally, an infrared light anti-reflection layer 707 can be included.

In this case, the ultraviolet light 700 is incident upon the infrared conversion layer 701. It is absorbed by the infrared conversion layer 701 and subsequently emitted as the infrared light. The emitted infrared light can follow three paths. In the first path 71, the infrared light is absorbed by the silicon photodiode 703 and converted into a photocurrent. In the second path 72, the infrared light is absorbed by the infrared conversion layer 701. In the original attempt to escape through the third path 73, the infrared light is reflected by the infrared reflection layer 705 and subsequently enters the silicon photodiode 703 and is absorbed again and converted into a photocurrent.

Additionally, a specific layer of the infrared light anti-reflection layer 707 can be disposed within the ultraviolet light sensing-enhanced photodiode 70 for complementing the ultraviolet light anti-reflection layer described in the embodiment depicted in FIG. 3 (such as the ultraviolet light anti-reflection layer 301 in FIG. 3). In the structure of the ultraviolet light sensing-enhanced photodiode, the infrared light anti-reflection layer 707 can also be disposed between the infrared conversion layer 701 and the silicon photodiode 703. Similarly, through the design of layer thickness, materials, and number of layers, the infrared light anti-reflection layer 707 can induce destructive interference in the reflected light generated by the infrared light incident to the ultraviolet light sensing-enhanced photodiode.

According to the embodiment, the pattern of the infrared light anti-reflection layer 707 may be determined as choosing the refractive index of the films in the infrared light anti-reflection layer close to $(n_{CV}/n_{IR\text{-}r})^{*}\sqrt{n_S}$, where $n_{CV}$ is the equivalent refractive index of the infrared conversion layer, $n_{IR\text{-}r}$ is the equivalent refractive index of the infrared reflection layer, and $n_S$ is the refractive index of the silicon photodiode.

According to the above embodiments, the structure of the ultraviolet light sensing-enhanced photodiode can choose one of the above embodiments as needed. Furthermore, the structure in the infrared conversion layer and the silicon photodiode can be made of homogeneous materials. In other words, the infrared conversion layer and the silicon photodiode can both be made of silicon material. Silicon belongs to indirect bandgap semiconductor, with a bandgap size of 1.12e V (X-Γ). Impurities can be implanted into the silicon material of the infrared conversion layer, such as P-type semiconductor impurities or N-type semiconductor impurities, to form shallow or deep impurity energy levels.

Taking the example of implanting P-type semiconductor impurities, electrons excited by the ultraviolet light entering the ultraviolet light sensing-enhanced photodiode will recombine with holes in the energy gap of the P-type semiconductor impurities to reduce the equivalent energy level for forming a P-type impurity energy level in the infrared conversion layer and to radiate light with a longer wavelength than the ultraviolet light. Conversely, in the case of implanting N-type semiconductor impurities, holes excited by the ultraviolet light recombine with electrons in the energy gap of the N-type semiconductor impurities to reduce the equivalent energy level for forming a N-type impurity energy level in the infrared conversion layer and to radiate light with a longer wavelength than the ultraviolet light. Therefore, by selecting different energy differences between the impurity energy levels and the energy levels of electronic conduction band, the wavelength of the radiated light can be adjusted to the infrared light band.

It is worth noting that the structures of the ultraviolet light sensing-enhanced photodiode disclosed in the various embodiments above are not intended to limit the scope of the invention. The layers and structures can be combined and replaced with each other as needed.

Figure 8:
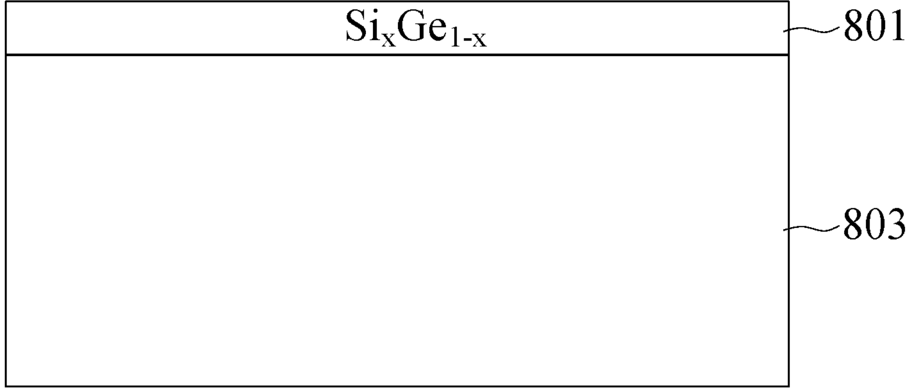
FIG. 8 shows one of the schematic views of an embodiment of the infrared conversion layer of the ultraviolet light sensing-enhanced photodiode.

The design of the infrared conversion layer mentioned above can be referred to in the exemplary diagram shown in FIG. 8. In the depicted ultraviolet light sensing-enhanced photodiode 80, there are two main components: the silicon photodiode 803 and the infrared conversion layer 801. In this example, the infrared conversion layer 801 can be a heterogeneous semiconductor structure compared to the silicon photodiode 803. For instance, the infrared conversion layer 801 can be made of silicon germanium ($Si_xGe_{1-x}$) material. Such silicon germanium materials have a smaller energy gap compared to silicon, making them direct bandgap semiconductors. Therefore, the infrared conversion layer and the silicon photodiode can be made of heterogeneous semiconductor materials. The energy gap of the infrared conversion layer is smaller than that of the silicon photodiode. By changing the proportion of materials (i.e., altering the ratio of silicon (Si) to germanium (Ge)), the wavelength of the radiated light can be adjusted to the band of the infrared light.

Figure 9:
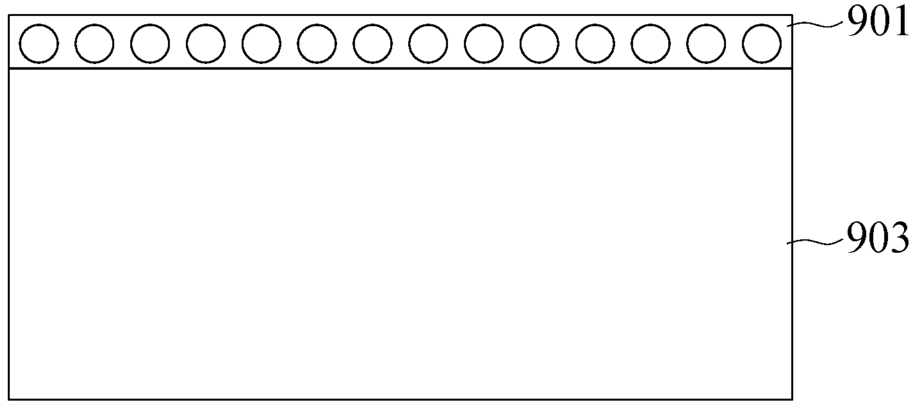
FIG. 9 shows another schematic view of the embodiment of the infrared conversion layer of the ultraviolet light sensing-enhanced photodiode.

FIG. 9 illustrates an exemplary view of the infrared conversion layer for the ultraviolet light sensing-enhanced photodiode. The main structure of the ultraviolet light sensing-enhanced photodiode 90 depicted in this figure includes the silicon photodiode 903 and the infrared conversion layer 901. Particularly, the infrared conversion layer 901 in this illustration is a structure including silicon germanium ($Si_xGe_{1-x}$) quantum dots. Through the quantum confinement effect, the conversion efficiency of the infrared conversion layer can be further enhanced.

Furthermore, the potential materials for the infrared conversion layer 901 are not limited to specific inorganic materials, such as silicon, germanium, and other semiconductor materials. It can also include organic materials, such as $Ca_{14-x/y}Zn_6Al_{10-z}O_{35}{:}Mn_z$, $Nd_x/Yb_y$, where the respective ranges for x, y, and z can be x=0.00 to 0.40, y=0.0 to 1.2, z=0.0 to 1.0. Additionally, dielectric materials like $Yb_2O_3$ doped transparent 40SrO—20$TiO_2$—40$SiO_2$ glass can also be used.

Figure 11:
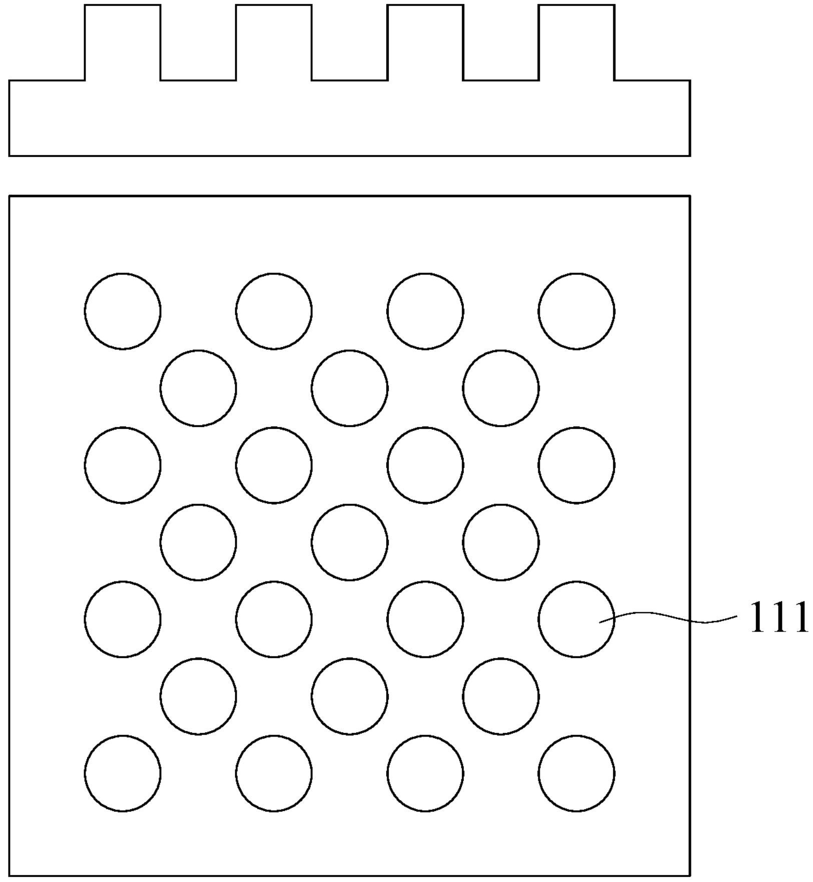
FIG. 11 shows a schematic view of an embodiment in which the infrared light total reflection stack layer in the ultraviolet light sensing-enhanced photodiode adopts a two-dimensional periodic array pattern.

FIG. 11 further illustrates an embodiment of the infrared light total reflection stacked layer in the ultraviolet light sensing-enhanced photodiode, employing a two-dimensional periodic array pattern.

This example demonstrates the ability to define a two-dimensional periodic array pattern in the infrared light total reflection stacked layer using photolithography etching technology on a dielectric or semiconductor material. The illustrated two-dimensional periodic array pattern 111, with carefully designed periodicity closely matching the wavelength of reflected infrared light, enables the reflection of the infrared light band.

In summary, the disclosed embodiments of the enhanced ultraviolet photodetector presented in this disclosure have the capability to elevate the weak optical response of conventional silicon photodiodes in the ultraviolet light band to a level comparable to the optical response in the infrared light band.

The above-disclosed content represents preferred and feasible embodiments of the present invention, and does not limit the scope of the patent application. Therefore, any equivalent technological variations made based on the content of this specification and drawings fall within the scope of the patent application for the present invention.

What is claimed is:

1. An ultraviolet light sensing-enhanced photodiode, including:

a silicon photodiode;

an infrared conversion layer formed on a surface of the silicon photodiode for receiving an ultraviolet light; and an infrared reflection layer disposed on a surface of the infrared conversion layer for receiving the incident ultraviolet light, wherein the ultraviolet light irradiates the infrared conversion layer, the infrared conversion layer absorbs and converts the ultraviolet light to radiate an infrared light, and a first portion of the infrared light is propagated to the silicon photodiode and converted to a photoelectric current by the silicon photodiode, and a second portion of the infrared light is absorbed by the infrared conversion layer, and wherein when the ultraviolet light irradiates the ultraviolet light sensing-enhanced photodiode, the ultraviolet light passes through and is absorbed by the infrared conversion layer to be converted into the infrared light, the infrared reflection layer is used to reflect a third portion of the infrared light that is originally escaped from the infrared reflection layer so that the third portion of the infrared light is reflected into the silicon photodiode and is converted into the photoelectric current by the silicon photodiode.

2. The ultraviolet light sensing-enhanced photodiode of claim 1, wherein the infrared reflection layer is an infrared light total reflection stacked layer that is made of a multilayer of high refractive index material dielectric films interlaced with low refractive index material dielectric films.

3. The ultraviolet light sensing-enhanced photodiode of claim 2, wherein a two-dimensional periodic array pattern is defined on a dielectric material or a semiconductor material through photolithography etching technology in the infrared light total reflection stacked layer.

4. The ultraviolet light sensing-enhanced photodiode of claim 1, further including an ultraviolet light anti-reflection layer disposed on a top layer of the ultraviolet light sensing-enhanced photodiode for forming destructive interference to a reflection light generated by the ultraviolet light incident to the ultraviolet light sensing-enhanced photodiode.

5. The ultraviolet light sensing-enhanced photodiode of claim 1, further including an infrared light anti-reflection layer disposed between the infrared conversion layer and the silicon photodiode for forming destructive interference to a reflection light generated by the infrared light incident to the silicon photodiode.

6. The ultraviolet light sensing-enhanced photodiode of claim 1, wherein the infrared conversion layer comprises a silicon material, the silicon material is implanted by P-type semiconductor impurities to form shallow or deep impurity energy levels so that electrons excited by the ultraviolet light recombine with holes in an energy gap of the P-type semiconductor impurities to reduce an equivalent energy level and to radiate light with a longer wavelength than the ultraviolet light.

7. The ultraviolet light sensing-enhanced photodiode of claim 6, wherein different impurity materials are selected to form the energy difference between the energy level and an electronic conduction band energy level so as to adjust the wavelength of the radiated light to a band of the infrared light.

8. The ultraviolet light sensing-enhanced photodiode of claim 1, wherein the infrared conversion layer comprises a silicon material, the silicon material is implanted by N-type semiconductor impurities to form shallow or deep impurity energy levels so that holes excited by the ultraviolet light recombine with electrons in an energy gap of the N-type semiconductor impurities to reduce an equivalent energy level and to radiate light with a longer wavelength than the ultraviolet light.

9. The ultraviolet light sensing-enhanced photodiode of claim 1, wherein the infrared conversion layer and the silicon photodiode are made of heterogeneous semiconductor materials, and an energy gap of the infrared conversion layer is smaller than that of the silicon photodiode, and the wavelength of the radiated light is able to be adjusted to a band of the infrared light by changing a proportion of the heterogeneous semiconductor materials.

10. The ultraviolet light sensing-enhanced photodiode of claim 1, wherein the infrared conversion layer is a structure including silicon germanium ($Si_xGe_{1-x}$) quantum dots.

* * * * *